(12) United States Patent
Huang et al.

(10) Patent No.: US 11,640,928 B2
(45) Date of Patent: May 2, 2023

(54) HEAT DISPERSION LAYERS FOR DOUBLE SIDED INTERCONNECT

(71) Applicant: Taiwan Semiconductor Manufacturing Company, Ltd., Hsinchu (TW)

(72) Inventors: Hsin-Yen Huang, New Taipei (TW); Shao-Kuan Lee, Kaohsiung (TW); Shau-Lin Shue, Hsinchu (TW); Hsiao-Kang Chang, Hsinchu (TW); Cherng-Shiaw Tsai, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/412,423

(22) Filed: Aug. 26, 2021

(65) Prior Publication Data

US 2023/0066284 A1 Mar. 2, 2023

(51) Int. Cl.
*H01L 21/48* (2006.01)
*H01L 23/48* (2006.01)
*H01L 23/52* (2006.01)
*H01L 23/367* (2006.01)
*H01L 23/522* (2006.01)
*H01L 23/373* (2006.01)

(52) U.S. Cl.
CPC ...... *H01L 23/3677* (2013.01); *H01L 21/4871* (2013.01); *H01L 23/373* (2013.01); *H01L 23/481* (2013.01); *H01L 23/5226* (2013.01)

(58) Field of Classification Search
CPC . H01L 23/373; H01L 23/481; H01L 23/5226; H01L 23/3677; H01L 21/4871
USPC ........ 257/774; 438/629, 637, 639, 640, 667, 438/668, 672, 675, 700, 701, 713, 978
See application file for complete search history.

(56) References Cited

U.S. PATENT DOCUMENTS

| | | | | |
|---|---|---|---|---|
| 10,854,530 B1* | 12/2020 | Cheng | ............ | H01L 23/481 |
| 2014/0346622 A1* | 11/2014 | Stuber | ............ | B81C 1/00238 |
| | | | | 438/51 |
| 2021/0082784 A1* | 3/2021 | Cheng | ............ | H01L 25/18 |
| 2021/0167056 A1* | 6/2021 | Or-Bach | ...... | H01L 21/823871 |

* cited by examiner

*Primary Examiner* — Didarul A Mazumder
(74) *Attorney, Agent, or Firm* — Eschweiler & Potashnik, LLC

(57) ABSTRACT

Various embodiments of the present disclosure are directed towards a semiconductor structure including a device layer having a front-side surface opposite a back-side surface. A first heat dispersion layer is disposed along the back-side surface of the device layer. A second heat dispersion layer underlies the front-side surface of the device layer. The second heat dispersion layer has a thermal conductivity lower than a thermal conductivity of the first heat dispersion layer.

20 Claims, 11 Drawing Sheets

HEAT DISPERSION LAYERS FOR DOUBLE SIDED INTERCONNECT

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
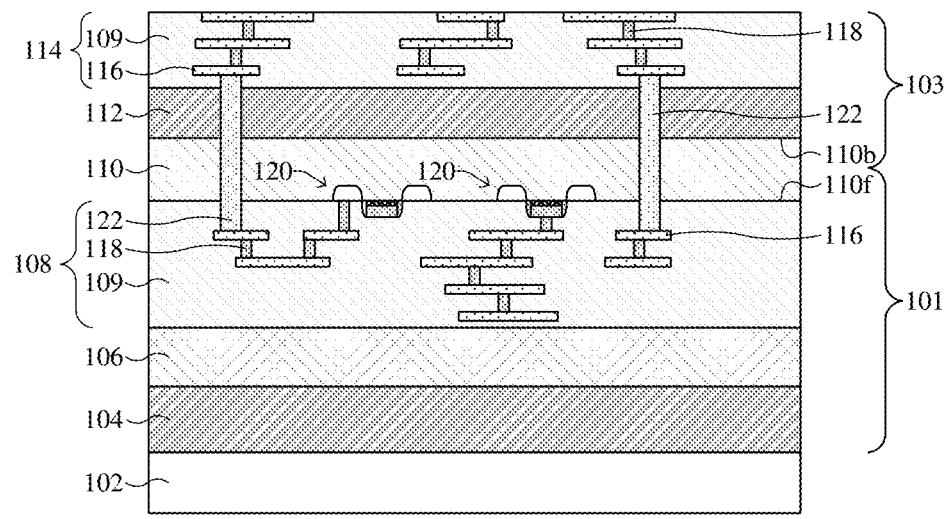
FIG. 1 illustrates some embodiments of a cross-sectional view of a three-dimensional (3D) integrated circuit (IC) structure comprising a plurality of heat dispersion layers disposed along a first interconnect structure and a second interconnect structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

A three-dimensional (3D) integrated circuit (IC) comprises a plurality of IC die that are stacked over one another. One possible method to manufacture a 3D IC includes a wafer stacking method that includes bonding a first 2D IC structure to a semiconductor wafer and subsequently forming a second 2D IC structure over the first 2D IC structure. The first 2D IC structure may include a first interconnect structure disposed along a front-side surface of a device layer. Forming the second 2D IC structure over the first 2D IC structure includes performing multiple processing steps to form a second interconnect structure over a back-side surface of the device layer. The first and second 2D IC structures may comprise high power semiconductor devices such as, for example, power metal-oxide-semiconductor field-effect transistors (MOSFETs) that may commonly be used in high voltage technology such as power management, regulator, battery protector, color display driver, microwave and radio frequency (RF) power amplifiers, etc. The high power semiconductor devices may be densely packed together and generate high temperatures during device operation due to high voltages and large currents. With the increase in complexity and/or shrinkage of device features of ICs, thermal management becomes more important to prevent device malfunction, performance degradation, and/or delamination between layers within the first and second 2D IC structures.

One challenge with the above 3D IC is heat accumulation during manufacturing and/or operation of the first and second 2D IC structures. For example, formation of the second 2D IC structure includes performing multiple processing steps such as deposition process(es), bonding process(es), or the like that may expose the first 2D IC structure to high processing temperatures (e.g., approximately 400 degrees Celsius or greater). The high processing temperatures may result in peeling between layers within the first 2D IC structure and/or diffusion of conductive materials throughout the first and second 2D IC structures, thereby resulting in electrical shorts and/or device malfunction. Further, the first and second 2D IC structures may comprise high power semiconductor devices (e.g., high voltage transistors, power MOSFETS, etc.). In an effort to increase power density in a 3D IC, the number of high power semiconductor devices disposed over a single semiconductor wafer is increased, and multiple 2D IC structures may be stacked on top of one another. Further, device features are shrunk and/or a distance between the high power semiconductor devices is reduced. However, during operation of the 3D IC, heat may accumulate in an area around each high power semiconductor device due to the high operating voltages and/or currents. This accumulated high heat may result in device malfunction, performance degradation, and/or peeling between layers within the first and second 2D IC structures.

Various embodiments of the present application are directed towards an improved method (and associated structure) for manufacturing a 3D IC structure that facilitates the dispersion of heat within the 3D IC structure. The method utilizes a plurality of heat dispersion layers disposed below and above a device layer, where the heat dispersion layers are configured to facilitate dispersion of heat during manufacturing and operation of the 3D IC structure. For example, manufacturing the 3D IC structure may include forming a first high-temperature heat dispersion layer over a sacrificial substrate. The first high-temperature heat dispersion layer is deposited at a high processing temperature (e.g., greater than or equal to 400 degrees Celsius) to facilitate the first high-temperature heat dispersion layer having a suitable first thermal conductivity (e.g., between approximately 500 to 2,000 W/m-K). For example, performing the deposition at the high processing temperature ensures the first high-temperature heat dispersion layer has a crystalline structure with relatively large grain sizes that facilitates the dispersion of heat across the first high-temperature heat dispersion layer. Further, a device layer is deposited over the first high-temperature heat dispersion layer, and a plurality of semiconductor devices (e.g., high voltage transistors) is formed on/over a front-side surface of the device layer. A first interconnect structure is formed on the front-side surface of the device layer, thereby defining a first 2D IC structure. Subsequently, a low-temperature heat dispersion layer is deposited along the first interconnect structure. The low-temperature heat dispersion layer is deposited at a low processing temperature (e.g., less than 400 degrees Celsius) to prevent damage to the first interconnect structure and the plurality of semiconductor devices. The low-temperature heat dispersion layer has a second thermal conductivity (e.g., between approximately 5 to 500 W/m-K) and is configured to facilitate the dispersion of heat away from the first interconnect structure and/or the device layer.

In addition, a second high-temperature heat dispersion layer is deposited at the high processing temperature over a carrier substrate and comprises the first thermal conductivity. The second high-temperature heat dispersion layer is deposited in a processing chamber separate from the first 2D IC structure to prevent damage to the first interconnect structure and/or the plurality of semiconductor devices. The second high-temperature heat dispersion layer is bonded to the low-temperature heat dispersion layer and is configured to facilitate the dispersion of heat away from the first interconnect structure and the device layer. The bonded carrier substrate and device layer are flipped, and the sacrificial substrate is removed, thereby exposing an upper surface of the first high-temperature heat dispersion layer. A second interconnect structure is formed over the first high-temperature heat dispersion layer, thereby defining a second 2D IC structure over the first 2D IC structure. The second 2D IC structure may comprise a second plurality of semiconductor devices disposed within the second interconnect structure and/or along a back-side surface of the device layer. The first and second high-temperature heat dispersion layers and the low-temperature heat dispersion layer are configured to mitigate the accumulation of heat within the first and second 2D IC structures. This, in part, prevents device malfunction, device performance degradation, and/or peeling between layers within the first and second 2D IC structures.

FIG. 1 illustrates some embodiments of a cross-sectional view of a three-dimensional (3D) integrated circuit (IC) structure 100 has a plurality of heat dispersion layers. In various embodiments, the plurality of heat dispersion layers includes a first high-temperature heat dispersion layer 112, a second high-temperature heat dispersion layer 104, and a low-temperature heat dispersion layer 106.

The 3D IC structure 100 includes a first IC structure 101 overlying a carrier substrate 102 and a second IC structure 103 overlying the first IC structure 101. In some embodiments, the carrier substrate 102 may, for example, be or comprise silicon, monocrystalline silicon/CMOS bulk, or another suitable semiconductor material. In further embodiments, the first IC structure 101 comprises a portion of a device layer 110, a first interconnect structure 108, the low-temperature heat dispersion layer 106, and the second high-temperature heat dispersion layer 104. In various embodiments, the device layer 110 may, for example, be or comprise silicon, polysilicon, monocrystalline silicon, silicon-germanium (SiGe), or another suitable semiconductor material. A first plurality of front-end of line (FEOL) semiconductor devices 120 is dispose within/on a front-side surface 110f of the device layer 110. The first interconnect structure 108 is disposed along the front-side surface 110f of the device layer 110. The low-temperature heat dispersion layer 106 is disposed between the first interconnect structure 108 and the second high-temperature heat dispersion layer 104. The second high-temperature heat dispersion layer 104 is disposed between the low-temperature heat dispersion layer 106 and the carrier substrate 102. In some embodiments, the second IC structure 103 comprises a portion of the device layer 110, the first high-temperature heat dispersion layer 112, and a second interconnect structure 114. The first high-temperature heat dispersion layer 112 is disposed along a back-side surface 110b of the device layer 110. The second interconnect structure 114 is disposed along an upper surface of the first high-temperature heat dispersion layer 112.

In some embodiments, the first and second interconnect structures 108, 114 comprise individual interconnect dielectric structures 109, individual pluralities of conductive vias 118, and individual pluralities of conductive wires 116. The pluralities of conductive wires and vias 116, 118 are disposed within the interconnect dielectric structures 109 and are configured to electrically couple one or more semiconductor devices to one another. In addition, one or more through-substrate vias (TSVs) 122 extend from the first interconnect structure 108, through the device layer 110 and the first high-temperature heat dispersion layer 112, to the second interconnect structure 114. The TSVs 122 are configured to electrically couple the conductive wires and vias 116, 118 within the first and second interconnect structures 108, 114 to one another. For example, the TSVs 122 are configured to electrically couple the first plurality of FEOL semiconductor devices 120 to the second interconnect structure 114.

In various embodiments, the first plurality of FEOL semiconductor devices 120 may comprise high power semiconductor devices (e.g., high voltage transistors, power MOSFETs) that utilize high voltages and/or currents during operation of the 3D IC structure 100. The high voltage and/or current may result in the generation of high heat within the device layer 110, the first interconnect structure 108, and/or the second interconnect structure 114. The presence of the heat dispersion layers 104, 106, 112 above and below the device layer 110 prevents the high heat from accumulating within the device layer 110, and the first and second interconnect structures 108, 114. This, in part, is because the heat dispersion layers 104, 106, 112 each comprise a dielectric material with a suitable crystalline structure that is configured to facilitate the transfer of heat. By prevent this accumulation of heat, the heat dispersion layers 104, 106, 112 mitigate damage (e.g., device malfunction, performance degradation, delamination, etc.) to the FEOL semiconductor devices 120 and the layers of the first and second interconnect structures 108, 114. Thus, the heat dispersion layers 104, 106, 112 increase the endurance, stability, and overall performance of the 3D IC structure 100.

In various embodiments, the first and second high-temperature heat dispersion layers 112, 104 and the low-temperature heat dispersion layer 106 respectively comprise a dielectric material, such as aluminum nitride (e.g., AlN), aluminum oxide (e.g., $Al_2O_3$), silicon nitride (e.g., $Si_3N_4$), silicon carbide (e.g., SiC), carbon (e.g., such as diamond, graphene, or the like), boron nitride (e.g., BN), beryllium oxide (e.g., BeO), magnesium oxide (e.g., MgO), another suitable material, or any combination of the foregoing. Further, the first and second high-temperature heat dispersion layers 112, 104 may be formed by a high temperature deposition process that facilities the first and second high-temperature heat dispersion layers 112, 104 having a crystalline structure with large grain sizes. These large grain sizes promote the transfer of heat across the crystalline structure of the first and second high-temperature heat dispersion layers 112, 104. In further embodiments, the high temperature deposition process ensures the first and second high-temperature heat dispersion layers 112, 104 have a first thermal conductivity that is approximately 500 to 2,000 W/m-K or another suitable value. In various embodiments, the low-temperature heat dispersion layer 106 may be formed directly on the first interconnect structure 108 by a low temperature deposition process that prevents damage to the FEOL semiconductor devices 120 and/or the first interconnect structure 108. In various embodiments, the low-temperature heat dispersion layer 106 has a second thermal conductivity that is approximately 5 to 500 W/m-K or another suitable value. In some embodiments, the first thermal conductivity is great than the second thermal conductivity. In yet further embodiments, the first and second thermal conductivities are each greater than a thermal conductivity of the interconnect dielectric structure 109 of the first and second interconnect structures 108, 114. In various embodiments, grain sizes of the low-temperature heat dispersion layer 106 are less than the large grain sizes of the first and second high-temperature heat dispersion layers 112, 104. In various embodiments, the first thermal conductivity of the first and second high-temperature heat dispersion layers 112, 104 is greater than a thermal conductivity of the plurality of conductive wires 116 and the plurality of conductive vias 118.

In various embodiments, the first and second high-temperature heat dispersion layers 112, 104 respectively have grains with grain sizes within a range of about 0.1 micrometers (um) to about 2 um, less than about 2 um, or another suitable value. In further embodiments, the low-temperature heat dispersion layer 106 has grains with grain sizes within a range of about 0.002 um to about 0.2 um, less than about 0.2 um, or another suitable value. In some embodiments, the first high-temperature heat dispersion layer 112 may be referred to as a first heat dispersion layer, the low-temperature heat dispersion layer 106 may be referred to as a second heat dispersion layer, and the second high-temperature heat dispersion layer 104 may be referred to as a third heat dispersion layer.

Figure 2A:
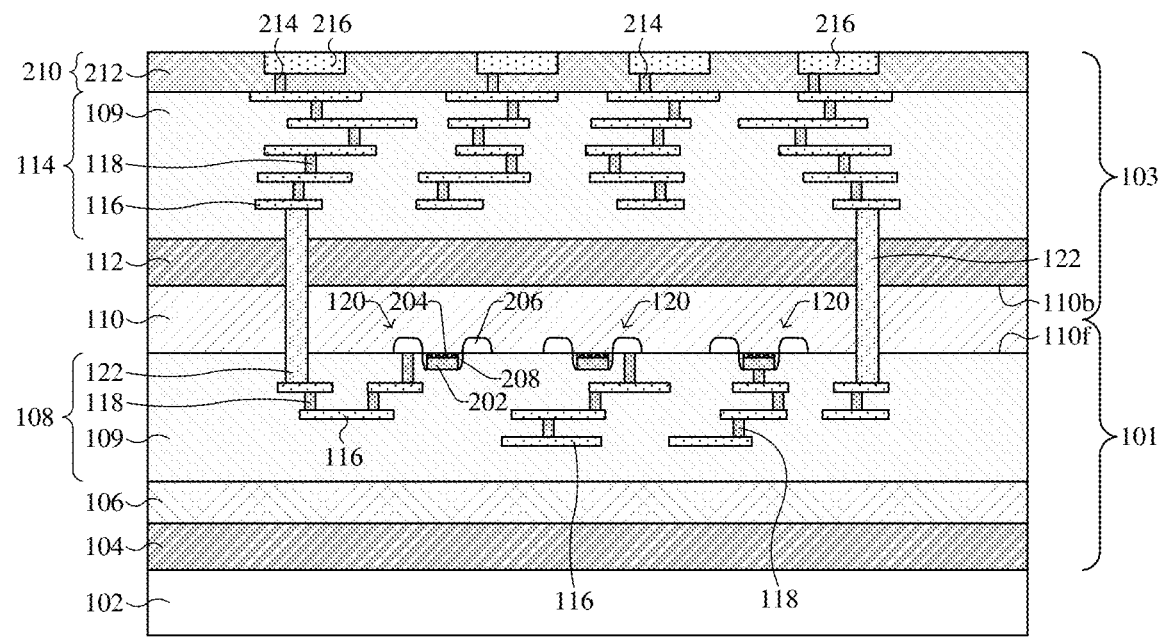
FIGS. 2A-2D illustrate cross-sectional views of some different alternative embodiments of the 3D IC structure of FIG. 1.

FIG. 2A illustrates some embodiments of a cross-sectional view of a three-dimensional (3D) integrated circuit (IC) structure 200a comprising a plurality of heat dispersion layers.

The 3D IC structure 200a includes a first IC structure 101 overlying a carrier substrate 102 and a second IC structure 103 overlying the first IC structure 101. The first IC structure 101 includes a portion of a device layer 110, a first interconnect structure 108, a low-temperature heat dispersion layer 106, and a second high-temperature heat dispersion layer 104. In various embodiments, the device layer 110 comprises silicon, monocrystalline silicon, polysilicon, another suitable substrate material, or the like. The first interconnect structure 108 is disposed along a front-side surface 110f of the device layer 110. The low-temperature heat dispersion layer 106 continuously extends along a lower surface of the first interconnect structure 108. The second high-temperature heat dispersion layer 104 continuously extends along a lower surface of the low-temperature heat dispersion layer 106. Further, the second high-temperature heat dispersion layer 104 continuously extends along an upper surface of the carrier substrate 102. In further embodiments, the second IC structure 103 includes a portion of the device layer 110, a first high-temperature heat dispersion layer 112, a second interconnect structure 114, and an input/output (I/O) structure 210. The first high-temperature heat dispersion layer 112 continuously extends along a back-side surface 110b of the device layer 110. The second interconnect structure 114 is disposed along an upper surface of the first high-temperature heat dispersion layer 112. The I/O structure 210 is disposed along an upper surface of the second interconnect structure 114.

In some embodiments, the first and second interconnect structures 108, 114 comprise individual interconnect dielectric structures 109, individual pluralities of conductive wires 116, and individual pluralities of conductive vias 118. In some embodiments, the interconnect dielectric structures 109 may be or comprise one or more inter-level dielectric (ILD) layers and/or one or more inter-metal dielectric (IMD) layers. The pluralities of conductive wires and vias 116, 118 are disposed within the interconnect dielectric structures 109 and are configured to electrically couple one or more semiconductor devices disposed within the 3D IC structure 200a to one another. In some embodiments, the interconnect dielectric structures 109 may, for example, be or comprise low-k dielectric materials, silicon dioxide, other suitable dielectric material(s), or any combination of the foregoing. In yet further embodiments, the plurality of conductive wires and vias 116, 118 may, for example, respectively be or comprise tungsten, ruthenium, titanium, titanium nitride, tantalum nitride, copper, aluminum, other conductive material(s), or any combination of the foregoing. In yet further embodiments, the first and second interconnect structures 108, 114 may each be or comprise front-end of line (FEOL) devices/layers, middle-end of line (MEOL) devices/layers, and/or back-end of line (BEOL) devices/layers. In addition, one or more through-substrate vias (TSVs) 122 extend from the first interconnect structure 108, through the device layer 110 and the first high-temperature heat dispersion layer 112, to the second interconnect structure 114. The TSVs 122 are configured to electrically couple the conductive wires and vias 116, 118 within the first and second interconnect structures 108, 114 to one another.

In some embodiments, the first IC structure 101 comprises a first plurality of FEOL semiconductor devices 120 that is disposed within/on the front-side surface 110f of the device layer 110. In an embodiment, the first plurality of FEOL semiconductor devices 120 may be configured as transistors and may each comprise a gate electrode 202, a gate dielectric layer 204, a sidewall spacer structure 208, and a pair of source/drain regions 206. The gate dielectric layer 204 is disposed between the gate electrode 202 and the front-side surface 110f of the device layer 110. The sidewall spacer structure 208 is disposed along sidewalls of the gate dielectric layer 204 and the gate electrode 202. Further, the pair of source/drain regions 206 may be disposed within the device layer 110 on opposing sides of the gate electrode 202. In various embodiments, the first plurality of FEOL semiconductor devices 120 may, for example, each be or comprise a metal oxide semiconductor field effect transistor (MOSFET), a high voltage transistor, a bipolar junction transistor (BJT), an n-channel metal oxide semiconductor (nMOS) transistor, a p-channel metal oxide semiconductor (pMOS) transistor, a gate-all-around FET (GAAFET), a gate-surrounding FET, a multi-bridge channel FET (MBCFET), a nanowire FET, a nanoring FET, a nanosheet field-effect transistor (NSFET), or the like. It will be appreciated that the first plurality of FEOL semiconductor devices 120 each being configured as another semiconductor device is also within the scope of the disclosure.

The I/O structure 210 may, for example, comprise a plurality of upper I/O contacts 216 (e.g., contact pads, solder bumps, etc.) that directly overlie a corresponding upper I/O via 214. The upper I/O contacts 216 and the upper I/O vias 214 are disposed within an upper dielectric structure 212. The upper I/O contacts 216 are directly electrically coupled to conductive wires and vias 116, 118 within the first and second interconnect structures 108, 114. Thus, the upper I/O contacts 216 are electrically coupled to the first plurality of FEOL semiconductor devices 120 by way of the interconnect layers (e.g., the conductive wires and vias 116, 118). The I/O structure 210 is configured to provide electrical connections to the 3D IC structure 200a. This, in part, may facilitate the 3D IC structure 200a being electrically coupled to another IC (not shown).

In various embodiments, during operation of the 3D IC structure 200a, the first plurality of FEOL semiconductor devices 120 and/or conductive layers disposed throughout the 3D IC structure 200a may be exposed to high temperature operating conditions. The conductive layers may include the conductive wires 116, the conductive vias 118, the TSVs 122, the upper I/O contacts 216, and the upper I/O vias 214. For example, the first plurality of FEOL semiconductor devices 120 may be configured as high voltage devices that utilize high voltage and/or high current during operation. The conductive layers are configured to deliver/apply the high voltage and/or high current to the first plurality of FEOL semiconductor devices 120. This high voltage and/or high current may result in a build up of high heat across the 3D IC structure 200a. The first and second high-temperature heat dispersion layers 112, 104 and the low-temperature heat dispersion layer 106 are configured to disperse the high heat away from the first plurality of FEOL semiconductor devices 120 and the conductive layers. By dispersing the heat away from the conductive layers and the FEOL semiconductor devices 120, device malfunction, device failure, and/or delamination of layers within the 3D IC structure 200a may be mitigated. This increases an endurance, reliability, and overall performance of the 3D IC structure 200a and facilitates the FEOL semiconductor devices 120 operating at high voltages and/or currents.

In various embodiments, the first IC structure 101 and/or the second IC structure 103 may each be configured as an application-specific integrated circuit (ASIC) device. Further, the first IC structure 101 and/or the second IC structure 103 may each comprise logic devices (e.g., transistors, diodes, etc.), memory devices (e.g., dynamic random-access memory (DRAM) devices, static random-access memory (SRAM) devices, magnetoresistive random-access memory (MRAM) devices, another suitable memory device, or any combination of the foregoing), another semiconductor device, or any combination of the foregoing.

Figure 2B:
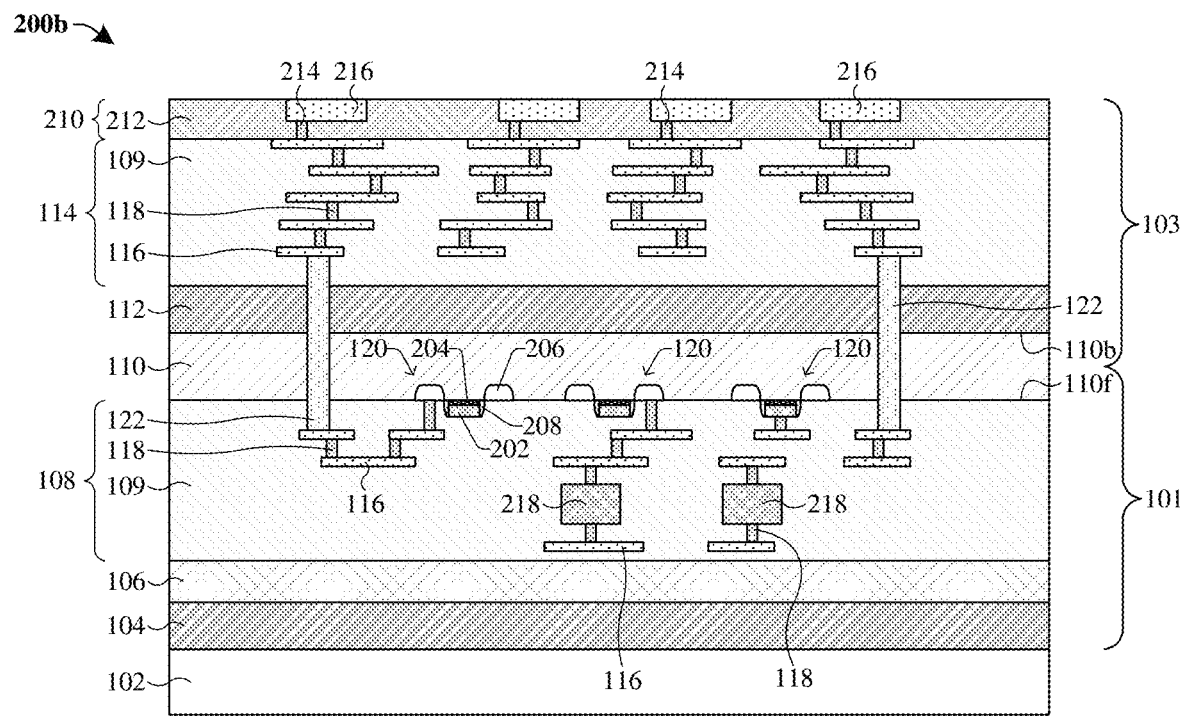

FIG. 2B illustrates a cross-sectional view of some embodiments of a 3D IC structure 200b corresponding to some alternative embodiments of the 3D IC structure 200a of FIG. 2A, in which a first plurality of BEOL semiconductor devices 218 is disposed within the first interconnect structure 108. In some embodiments, each BEOL semiconductor device in the first plurality of BEOL semiconductor devices 218 may, for example, be configured as a DRAM device, an SRAM device, an MRAM device, another suitable memory device, a capacitor, or another semiconductor device. In further embodiments, the first plurality of BEOL semiconductor devices 218 is disposed between layers of conductive wires 116 within the first interconnect structure 108.

Figure 2C:
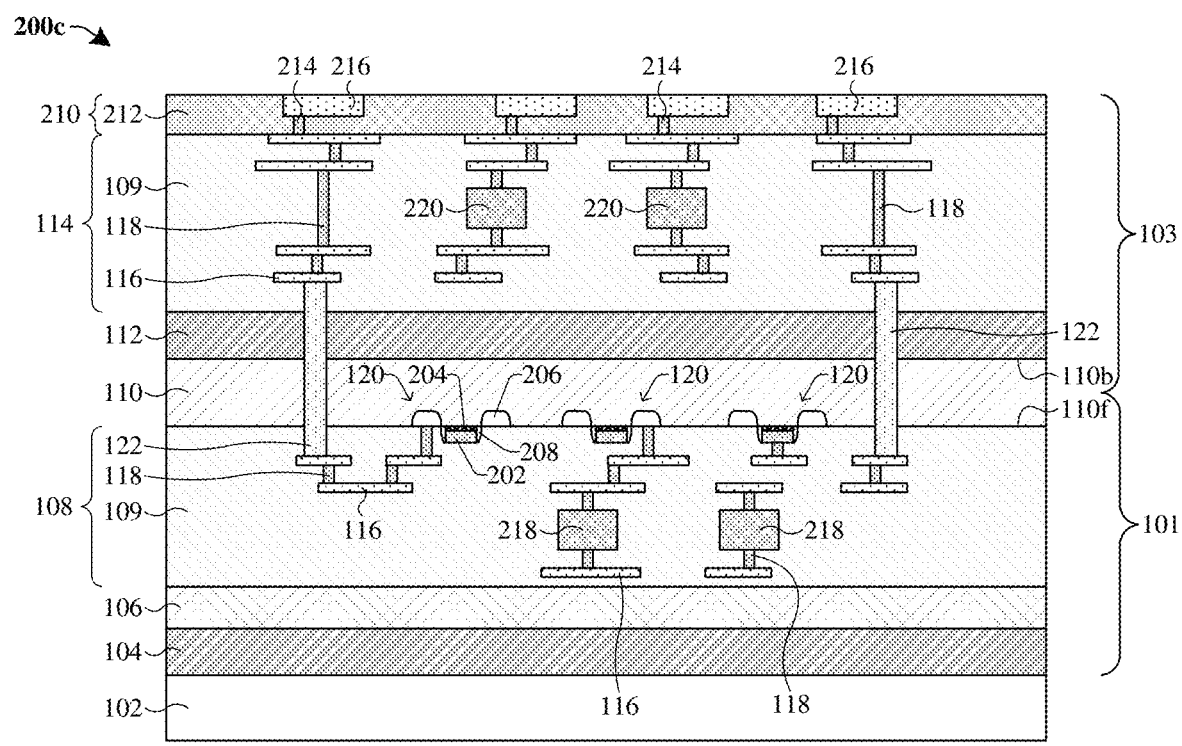

FIG. 2C illustrates a cross-sectional view of some embodiments of a 3D IC structure 200c corresponding to some alternative embodiments of the 3D IC structure 200a of FIG. 2A, in which a second plurality of BEOL semiconductor devices 220 is disposed within the second interconnect structure 114. In some embodiments, each BEOL semiconductor device in the second plurality of BEOL semiconductor devices 220 may, for example, be configured as a DRAM device, an SRAM device, an MRAM device, another suitable memory device, a capacitor, or another semiconductor device. In further embodiments, the second plurality of BEOL semiconductor devices 220 is disposed between layers of conductive wires 116 within the second interconnect structure 114.

Figure 2D:
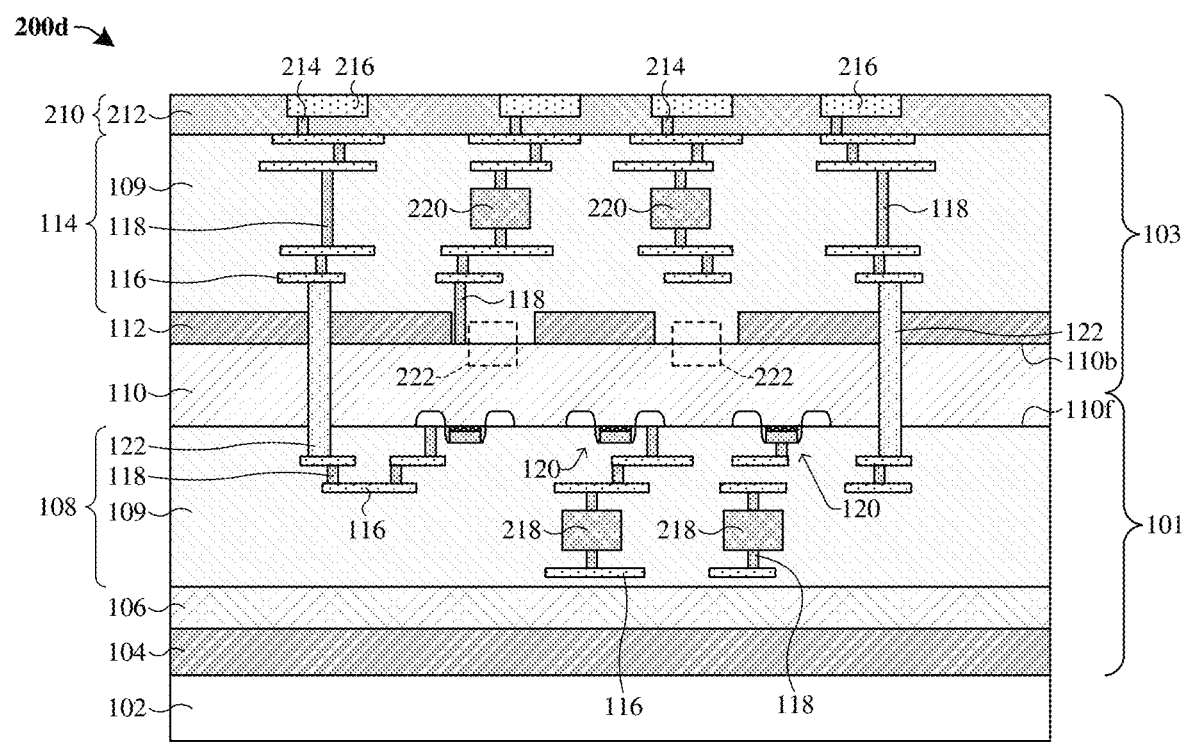

FIG. 2D illustrates a cross-sectional view of some embodiments of a 3D IC structure 200d corresponding to some alternative embodiments of the 3D IC structure 200a of FIG. 2A, in which the second IC structure 103 comprises a second plurality of FEOL semiconductor devices 222 that is disposed within/on the back-side surface 110b of the device layer 110. In various embodiments, the second plurality of FEOL semiconductor devices 222 may each be configured as a transistor, a high voltage semiconductor device, or another suitable semiconductor device. In various embodiments, the interconnect dielectric structure 109 of the second interconnect structure 114 extends along opposing sidewalls of the first high-temperature heat dispersion layer 112 to a point below the upper surface of the first high-temperature heat dispersion layer 112.

Figure 3:
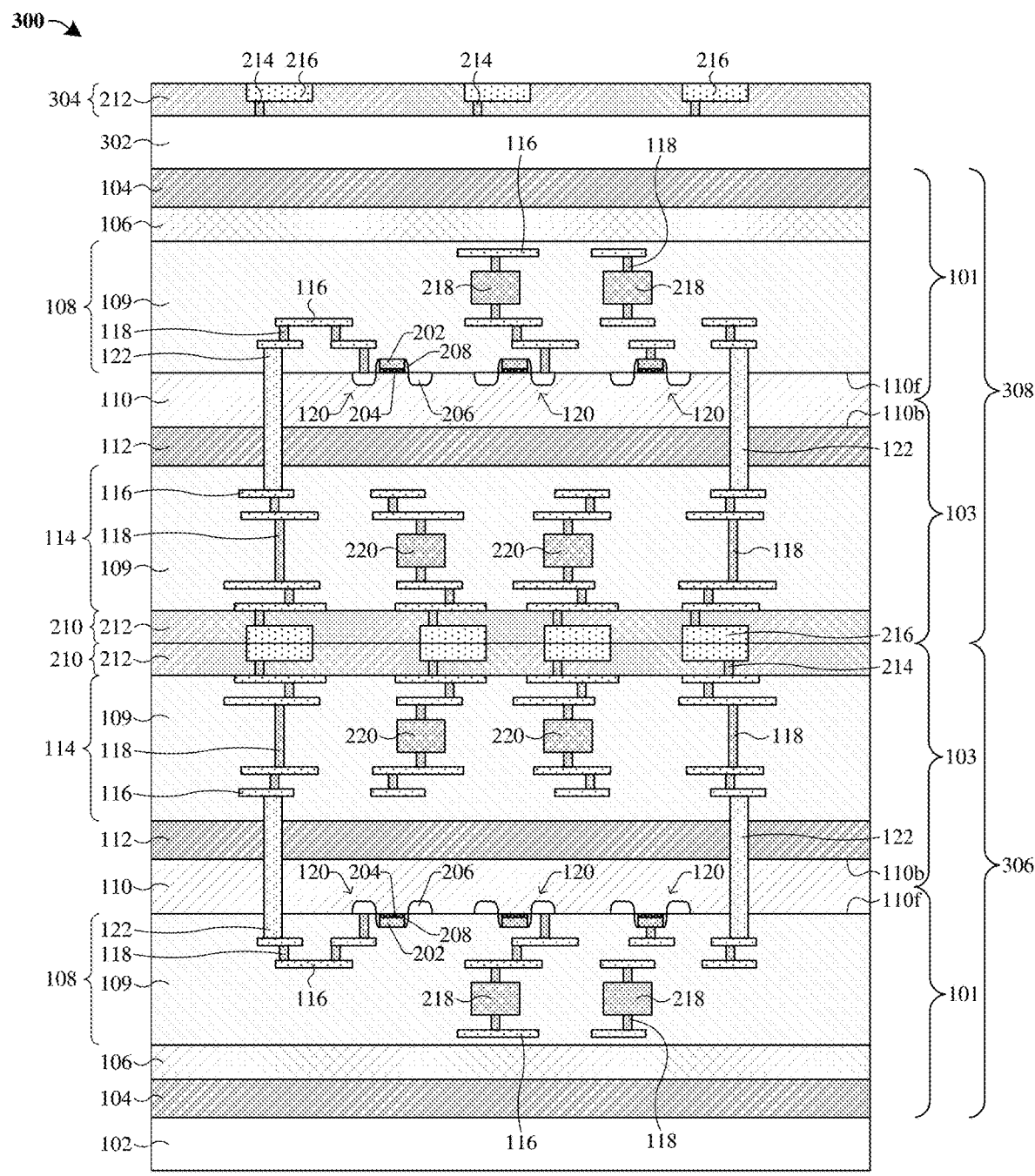
FIG. 3 illustrates some embodiments of an integrated chip comprising a plurality of heat dispersion layers disposed within a plurality of 2D IC structures.

FIG. 3 illustrates a cross-sectional view of some embodiments of an integrated chip 300 comprising a plurality of heat dispersion layers. The integrated chip 300 includes an upper IC structure 308 overlying a lower IC structure 306. In various embodiments, the lower and upper IC structures 306, 308 may each be configured as the 3D IC structure of FIG. 2A, 2B, 2C, or 2D. Further, the lower IC structure 306 is electrically coupled to the upper IC structure 308 by way of the I/O structures 210. An upper semiconductor wafer 302 is disposed along the second high-temperature heat dispersion layer 104 of the upper IC structure 308. In further embodiments, an upper I/O structure 304 overlies the upper semiconductor wafer 302. The upper I/O structure 304 may be electrically coupled to the upper IC structure 308 and/or the lower IC structure 306 by a plurality of upper TSVs (not shown) that extend through the upper semiconductor wafer 302.

FIGS. 4-13 illustrate cross-sectional views of some embodiments of a method for manufacturing a 3D IC structure comprising a plurality of heat dispersion layers according to the present disclosure. Although the cross-sectional views shown in FIGS. 4-13 are described with reference to a method, it will be appreciated that the structures shown in FIGS. 4-13 are not limited to the method but rather may stand alone separate of the method. Furthermore, although FIGS. 4-13 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 4:
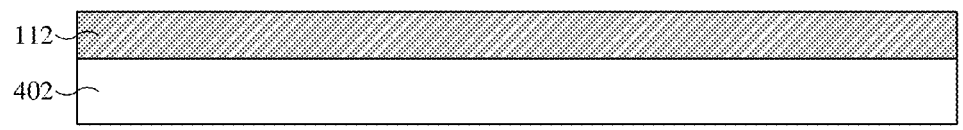
FIGS. 4-13 illustrate some embodiments of cross-sectional views of a method for forming a 3D IC structure comprising a plurality of heat dispersion layers.

As shown in the cross-sectional view 400 of FIG. 4, a first high-temperature heat dispersion layer 112 is formed along an upper surface of a sacrificial substrate 402. In various embodiments, the sacrificial substrate 402 may be referred to as a semiconductor substrate or a carrier substrate. In some embodiments, the sacrificial substrate 402 is or comprises monocrystalline silicon, some other silicon material, some other semiconductor material, or any combination of the foregoing. In various embodiments, the first high-temperature heat dispersion layer 112 completely covers the upper surface of the sacrificial substrate 402. In further embodiments, the first high-temperature heat dispersion layer 112 has a first thermal conductivity within a range of approximately 500 to 2,000 W/m-K, or another suitable value. In various embodiments, the first high-temperature heat dispersion layer 112 may, for example, be or comprise aluminum nitride (e.g., AlN), aluminum oxide (e.g., $Al_2O_3$), silicon nitride (e.g., $Si_3N_4$), silicon carbide (e.g., SiC), carbon (e.g., such as diamond, graphene, or the like), boron nitride (e.g., BN), beryllium oxide (e.g., BeO), magnesium oxide (e.g., MgO), another suitable material, or any combination of the foregoing. In further embodiments, the first high-temperature heat dispersion layer 112 is formed to a thickness within a range of approximately 10 nanometers (nm) to 5 micrometers (um), or another suitable thickness value.

In some embodiments, a process for forming the first high-temperature heat dispersion layer 112 comprises depositing the first high-temperature heat dispersion layer 112 by chemical vapor deposition (CVD), physical vapor deposition (PVD), atomic layer deposition (ALD), some other deposition process, or any combination of the foregoing. In further embodiments, the first high-temperature heat dispersion layer 112 is deposited at high processing temperatures of approximately 400 degrees Celsius or greater. Depositing (e.g., by CVD, PVD, or ALD) the first high-temperature heat dispersion layer 112 at the high processing temperatures ensures the first high-temperature heat dispersion layer 112 has the first thermal conductivity (e.g., within the range of approximately 500 to 2,000 W/m-K). This, in part, is because the high processing temperatures ensure the first high-temperature heat dispersion layer 112 is formed with a crystalline structure with relatively large grain sizes that facilitates the dispersion of heat across the crystalline structure of the first high-temperature heat dispersion layer 112. In various embodiments, the first thermal conductivity of the first high-temperature heat dispersion layer 112 is relatively large (e.g., greater than 500 W/m-K) and facilitates the dispersion of heat during subsequent processing steps and/or during operation of semiconductor devices formed on/over the first high-temperature heat dispersion layer 112.

Figure 5:
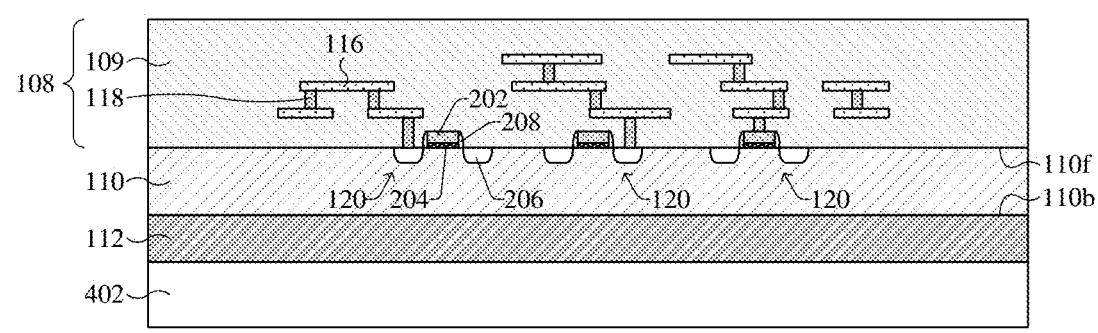

As shown in cross-sectional view 500 of FIG. 5, a device layer 110 is formed over the first high-temperature heat dispersion layer 112. In various embodiments, the device layer 110 is or comprises polysilicon, monocrystalline silicon, some other semiconductor material, or any combination of the foregoing. In further embodiments, a process for forming the device layer 110 comprises depositing the device layer 110 by CVD, epitaxy, or another suitable deposition or growth process. For example, the device layer 110 may be formed by molecular beam epitaxy (MBE), vapor phase epitaxy (VPE), liquid phase epitaxy (LPE), some other epitaxial process, or any combination of the foregoing.

Further, as shown in FIG. 5, a plurality of FEOL semiconductor devices 120 and a first interconnect structure 108 are formed over/on a front-side surface 110$f$ of the device layer 110. In various embodiments, the first interconnect structure 108 comprises an interconnect dielectric structure 109, a plurality of conductive wires 116, and a plurality of conductive vias 118. In various embodiments, the interconnect dielectric structure 109 may be or comprise one or more inter-level dielectric (ILD) layers and/or one or more inter-metal dielectric (IMD) layers. The one or more ILD layers and/or the one or more IMD layers may be deposited by CVD, PVD, ALD, or another suitable growth or deposition process. Further, the one or more ILD layers and/or the one or more IMD layers are formed at low processing temperatures (e.g., less than 400 degrees Celsius) that are less than the high processing temperatures (e.g., 400 degrees Celsius or greater) to prevent damage (e.g., device damage, delamination, etc.) to the first plurality of FEOL semiconductor devices 120, the plurality of conductive wires 116, and/or the plurality of conductive vias 118.

In further embodiments, the plurality of conductive wires and vias 116, 118 may be formed by a single damascene process, a dual damascene process, or another suitable formation process. In yet further embodiments, the plurality of conductive wires and vias 116, 118 may, for example, respectively be or comprise tungsten, ruthenium, titanium, titanium nitride, tantalum nitride, copper, aluminum, other conductive material(s), or any combination of the foregoing. By virtue of the first high-temperature heat dispersion layer 112 comprising the relatively large first thermal conductivity (e.g., within a range of approximately 500 to 2,000 W/m-K) the first high-temperature heat dispersion layer 112 may disperse heat away from the first plurality of FEOL semiconductor devices 120 and the first interconnect structure 108. This, in part, mitigates damage (e.g., device damage, delamination, etc.) to the first plurality of FEOL semiconductor devices 120 and the first interconnect structure 108 during the aforementioned processing steps and during subsequent processing steps.

Figure 6:
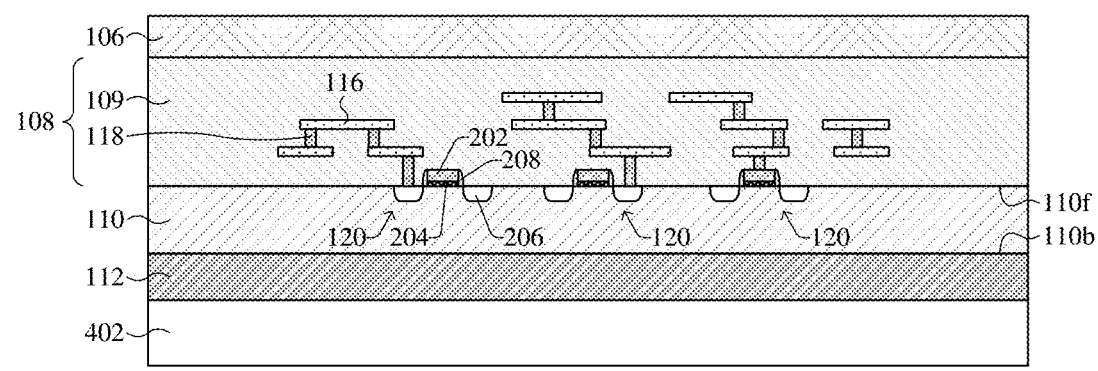

As shown in the cross-sectional view 600 of FIG. 6, a low-temperature heat dispersion layer 106 is formed along an upper surface of the first interconnect structure 108. In various embodiments, the low-temperature heat dispersion layer 106 completely covers an upper surface of the interconnect dielectric structure 109 of the first interconnect structure 108. In further embodiments, the low-temperature heat dispersion layer 106 has a second thermal conductivity within a range of approximately 5 to 500 W/m-K or another suitable value. In various embodiments the low-temperature heat dispersion layer 106 may, for example, be or comprise aluminum nitride (e.g., AlN), aluminum oxide (e.g., $Al_2O_3$), silicon nitride (e.g., $Si_3N_4$), silicon carbide (e.g., SiC), carbon (e.g., such as diamond, graphene, or the like), boron nitride (e.g., BN), beryllium oxide (e.g., BeO), magnesium oxide (e.g., MgO), another suitable material, or any combination of the foregoing. In further embodiments, the low-temperature heat dispersion layer 106 is formed to a thickness within a range of approximately 10 nanometers (nm) to 5 micrometers (um), or another suitable thickness value. In some embodiments, the low-temperature heat dispersion layer 106 comprises a same material (e.g., aluminum nitride, aluminum oxide, silicon nitride, silicon carbide, diamond, graphene, boron nitride, beryllium oxide, magnesium oxide, or the like) as the first high-temperature heat dispersion layer 112 with a lower thermal conductivity than the first high-temperature heat dispersion layer 112. For example, the low-temperature heat dispersion layer 106 has the second thermal conductivity less than approximately 500 W/m-K and the first high-temperature heat dispersion layer 112 has the first thermal conductivity greater than approximately 500 W/m-K.

In some embodiments, a process for forming the low-temperature heat dispersion layer 106 comprises depositing the low-temperature heat dispersion layer 106 by CVD, PVD, ALD, some other deposition process, or any combination of the foregoing. In further embodiments, the low-temperature heat dispersion layer 106 is deposited at low processing temperatures less than approximately 400 degrees Celsius. Depositing (e.g., by CVD, PVD, or ALD) the low-temperature heat dispersion layer 106 at the low processing temperatures (e.g., less than approximately 400 degrees Celsius) ensures the low-temperature heat dispersion layer 106 has the second thermal conductivity (e.g., within the range of approximately 5 to 500 W/m-K) while preventing damage (e.g., delamination, device damage, etc.) to the first plurality of FEOL semiconductor devices 120 and/or layers within the first interconnect structure 108. Further, the low-temperature heat dispersion layer 106 is formed with a crystalline structure that facilitates dispersion of heat across the crystalline structure of the low-temperature heat dispersion layer 106. In further embodiments, because the low-temperature heat dispersion layer 106 is formed at a lower temperature than the first high-temperature heat dispersion layer 112, grain sizes of the low-temperature heat dispersion layer 106 are smaller than the relatively large grain sizes of the first high-temperature heat dispersion layer 112. In various embodiments, the low-temperature heat dispersion layer 106 is configured to disperse heat away from the first interconnect structure 108 and the first plurality of FEOL semiconductor devices 120 during subsequent processing steps and/or during operation of the FEOL semiconductor devices 120. In addition, by depositing the low-temperature heat dispersion layer 106 at a temperature less than approximately 400 degrees Celsius, diffusion of a diffusive species (e.g., copper) from the conductive wires and/or vias 116, 118 may be mitigated.

Figure 7:

As shown in the cross-sectional view 700 of FIG. 7, a second high-temperature heat dispersion layer 104 is formed along an upper surface of a carrier substrate 102. In some embodiments, the carrier substrate 102 is or comprises monocrystalline silicon, some other silicon material, some other semiconductor material, or any combination of the foregoing. In various embodiments, the second high-temperature heat dispersion layer 104 completely covers the upper surface of the carrier substrate 102. In further embodiments, the second high-temperature heat dispersion layer 104 has the first thermal conductivity within a range of approximately 500 to 2,000 W/m-K, or another suitable value. In various embodiments, the second high-temperature heat dispersion layer 104 may, for example, be or comprise aluminum nitride (e.g., AlN), aluminum oxide (e.g., $Al_2O_3$), silicon nitride (e.g., $Si_3N_4$), silicon carbide (e.g., SiC), carbon (e.g., such as diamond, graphene, or the like), boron nitride (e.g., BN), beryllium oxide (e.g., BeO), magnesium oxide (e.g., MgO), another suitable material, or any combination of the foregoing. In further embodiments, the second high-temperature heat dispersion layer 104 is formed to a thickness within a range of approximately 10 nanometers (nm) to 5 micrometers (um), or another suitable thickness value. In yet further embodiments, the second high-temperature heat dispersion layer 104 comprises a same material as the first high-temperature heat dispersion layer (112 of FIG. 6) and/or the low-temperature heat dispersion layer (106 of FIG. 6).

In some embodiments, a process for forming the second high-temperature heat dispersion layer 104 comprises depositing the second high-temperature heat dispersion layer 104 by CVD, PVD, ALD, some other deposition process, or any combination of the foregoing. In further embodiments, the second high-temperature heat dispersion layer 104 is deposited at the high processing temperatures of approximately 400 degrees Celsius or greater. Depositing (e.g., by CVD, PVD, or ALD) the second high-temperature heat dispersion layer 104 at the high processing temperatures ensures the second high-temperature heat dispersion layer 104 has the first thermal conductivity (e.g., within the range of approximately 500 to 2,000 W/m-K). This, in part, is because the high processing temperatures ensure the second high-temperature heat dispersion layer 104 is formed with a crystalline structure with relatively large grain sizes that facilitates the dispersion of heat across the crystalline structure of the second high-temperature heat dispersion layer 104. In various embodiments, the first thermal conductivity of the second high-temperature heat dispersion layer 104 is relatively large (e.g., greater than 500 W/m-K) and facilitates the dispersion of heat during subsequent processing steps and/or during operation of the FEOL semiconductor devices (120 of FIG. 6).

In yet further embodiments, the second high-temperature heat dispersion layer 104 is formed within a processing chamber separate from the device layer (110 of FIG. 6). This, in part, ensures that the high processing temperatures (e.g., approximately 400 degrees Celsius or greater) utilized to form the second high-temperature heat dispersion layer 104 does not damage layers of the first interconnect structure (108 of FIG. 6) and/or the FEOL semiconductor devices (120 of FIG. 6).

Figure 8:
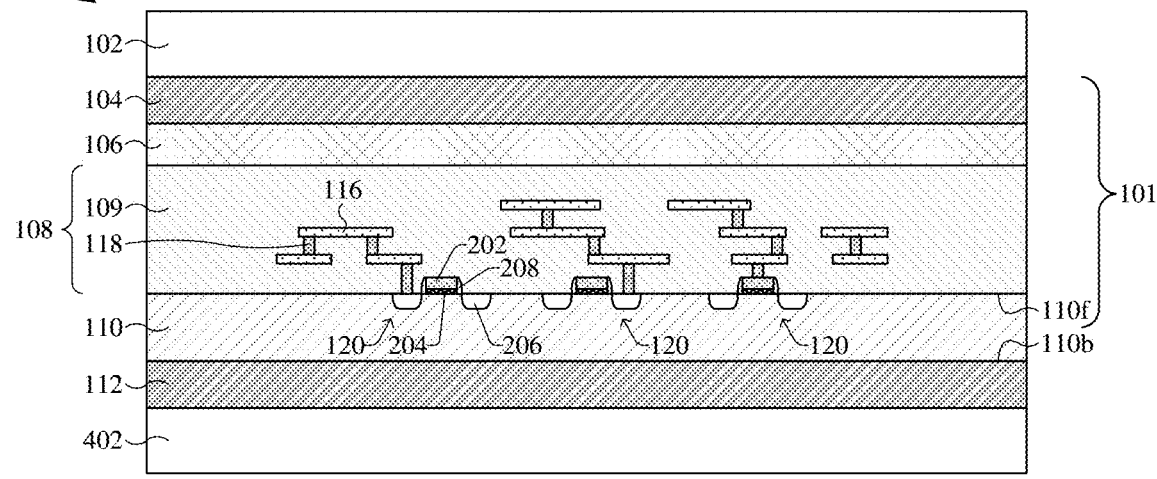

As shown in the cross-sectional view 800 of FIG. 8, the carrier substrate 102 and the second high-temperature heat dispersion layer 104 are flipped and bonded to the low-temperature heat dispersion layer 106, thereby defining a first IC structure 101. In various embodiments, the second high-temperature heat dispersion layer 104 and the low-temperature heat dispersion layer 106 meet at a bonding interface that comprises dielectric-to-dielectric bonds between the second high-temperature heat dispersion layer 104 and the low-temperature heat dispersion layer 106. In yet further embodiments, the second high-temperature heat dispersion layer 104 is bonded to the low-temperature heat dispersion layer 106 by, for example, fusion bonding, or another suitable bonding process at temperatures less than 400 degrees Celsius. Bonding the second high-temperature heat dispersion layer 104 to the low-temperature heat dispersion layer 106 with the temperatures less than 400 degrees Celsius mitigates damage to the first interconnect structure 108 and the first plurality of FEOL semiconductor devices 120.

In yet further embodiments, if the second high-temperature heat dispersion layer 104 comprises the same material as the low-temperature heat dispersion layer 106, then an interfacial adhesion energy of the bond interface between the second high-temperature heat dispersion layer 104 and the low-temperature heat dispersion layer 106 may be increased.

Figure 9:
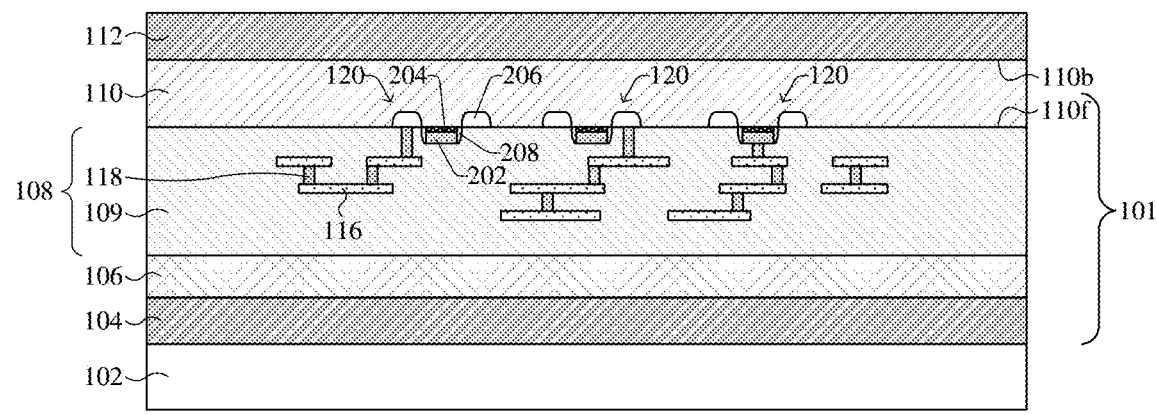

As shown in the cross-sectional view 900 of FIG. 9, the structure of FIG. 8 is flipped and a removal process is performed to remove the sacrificial substrate (402 of FIG. 8). In various embodiments, the removal process may include performing a chemical mechanical polishing (CMP) process, a mechanical grinding process, another suitable removal process, or any combination of the foregoing.

Figure 10:
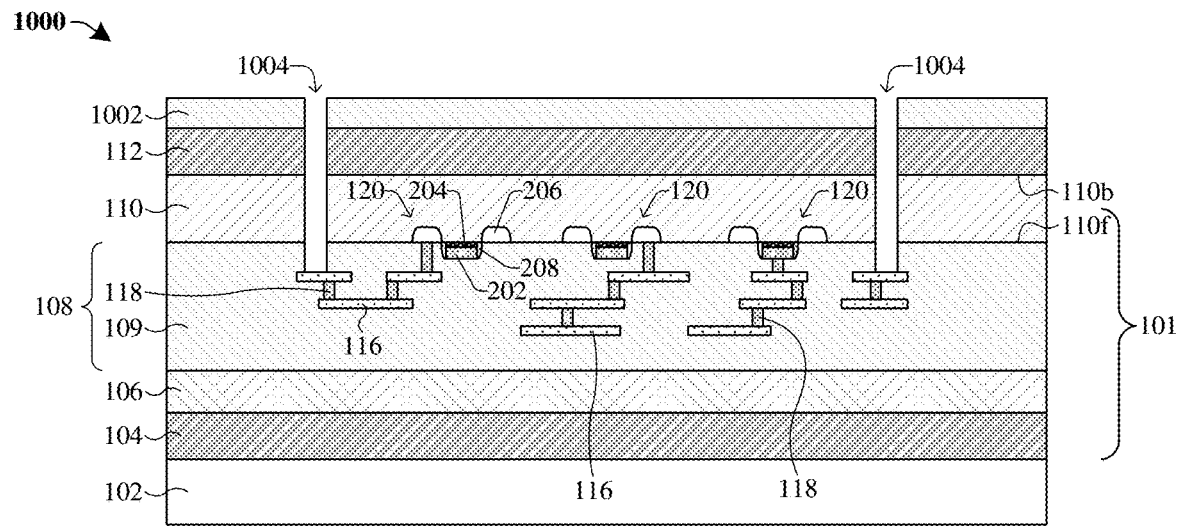

As shown in the cross-sectional view 1000 of FIG. 10, a dielectric layer 1002 is formed over the first high-temperature heat dispersion layer 112. In some embodiments, forming the dielectric layer 1002 may include depositing the dielectric layer 1002 on the first high-temperature heat dispersion layer 112 by CVD, PVD, ALD, another suitable growth or deposition process, or any combination of the foregoing. The dielectric layer 1002 may, for example, be or comprise silicon dioxide, a low-k dielectric material, another dielectric material, or any combination of the foregoing. Further, a patterning process is performed on the dielectric layer 1002, thereby defining a plurality of openings 1004 and exposing one or more conductive wires 116 within the first interconnect structure 108. In some embodiments, the patterning process includes: forming a masking layer (not shown) over the dielectric layer 1002; performing an etching process on the dielectric layer 1002 and underlying layers according to the masking layer, thereby defining the openings 1004; and performing a removal process to remove the masking layer. In further embodiments, the etching process may be a dry etching process, a wet etching process, a reactive ion etching (RIE) process, some other etching process, or any combination of the foregoing.

Figure 11:
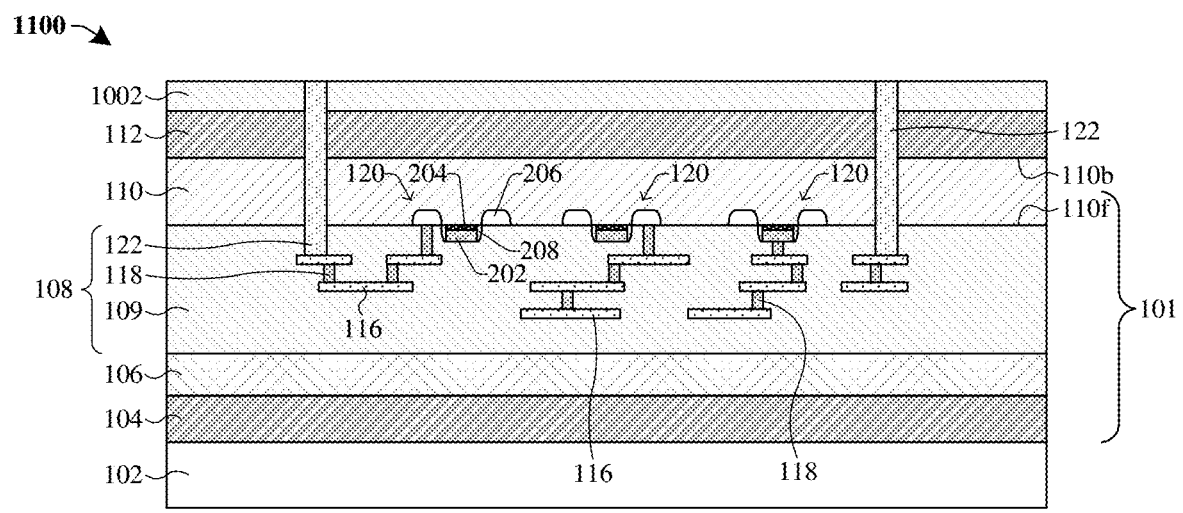

As shown in the cross-sectional view 1100 of FIG. 11, a plurality of through-substrate vias (TSVs) 122 is formed over the first interconnect structure 108. In some embodiments, a process for forming the TSVs 122 may include: depositing (e.g., by CVD, PVD, sputtering, electro plating, electroless plating, etc.) a conductive material over the dielectric layer 1002 such that the conductive material fills the openings (1004 of FIG. 10); and performing a planarization process (e.g., a CMP process) into the conductive material, thereby forming the plurality of TSVs 122. In various embodiments, the plurality of TSVs 122 may, for example, be or comprise copper, tungsten, aluminum, another conductive material, or any combination of the foregoing.

Figure 12:
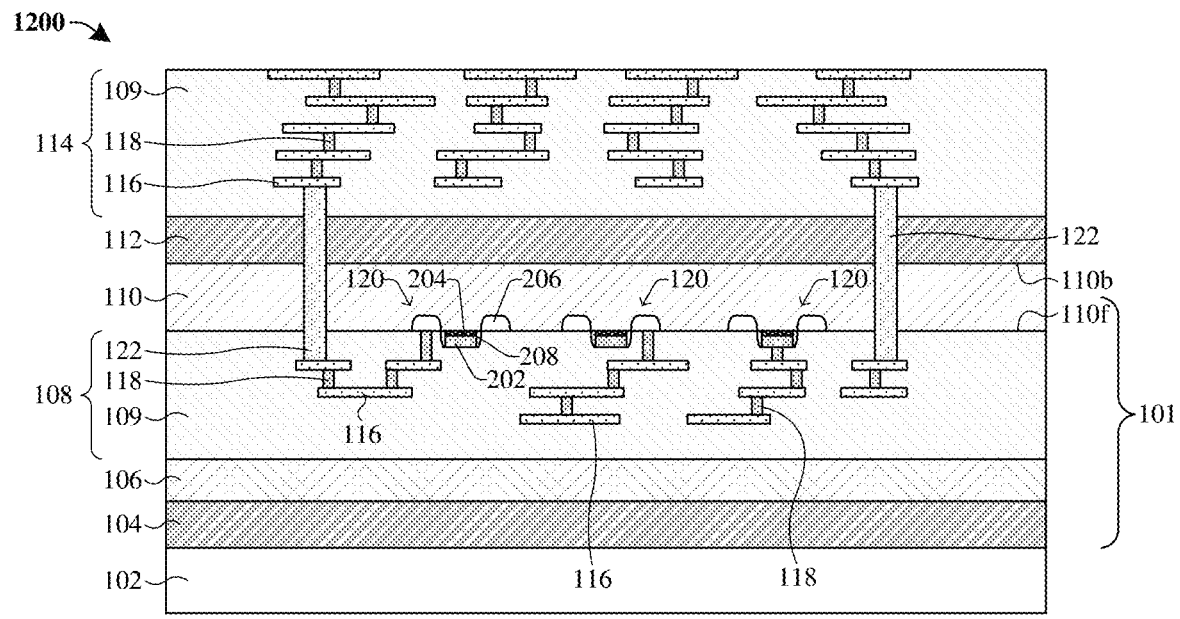

As shown in the cross-sectional view 1200 of FIG. 12, a second interconnect structure 114 is formed over the first high-temperature heat dispersion layer 112. In various embodiments, the second interconnect structure 114 comprises an interconnect dielectric structure 109, a plurality of conductive wires 116, and a plurality of conductive vias 118. In some embodiments, the dielectric layer (1002 of FIG. 11) is part of the interconnect dielectric structure 109 of the second interconnect structure 114. In further embodiments, the plurality of conductive wires and vias 116, 118 are formed by a single damascene process, a dual damascene process, or another suitable formation process. In yet further embodiments, the plurality of conductive wires and vias 116, 118 may be formed by one or more deposition process(es), one or more patterning process(es), one or more planarization process(es), or some other suitable process(es).

Figure 13:
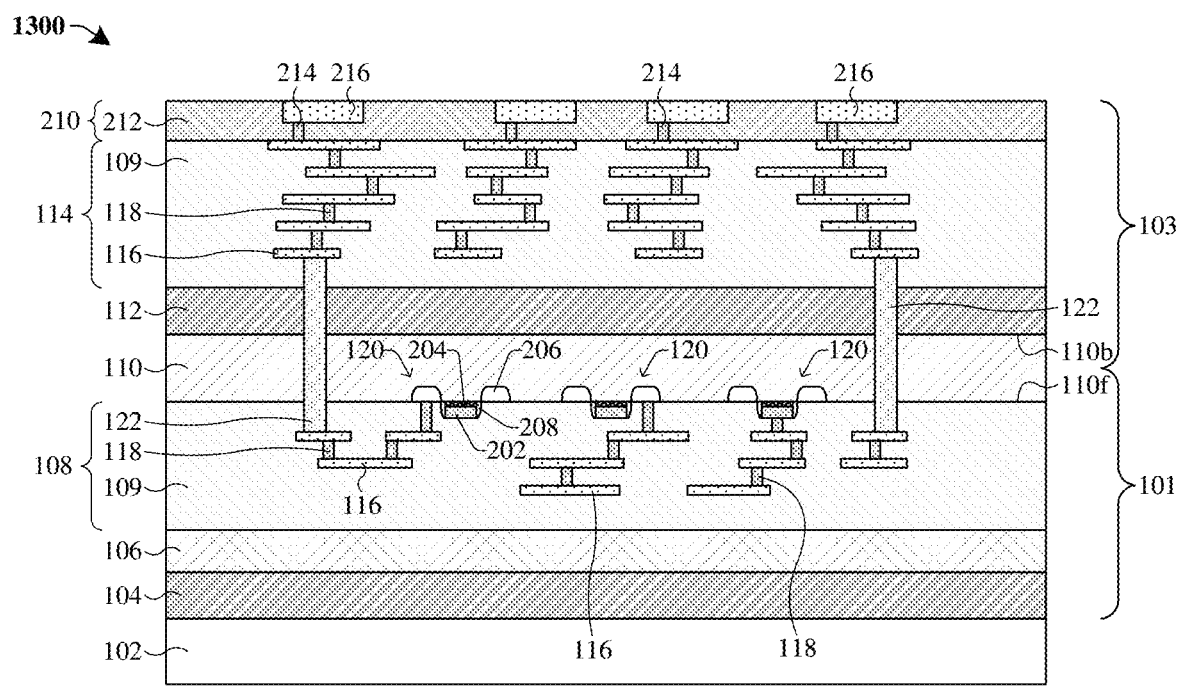

As shown in the cross-sectional view 1300 of FIG. 13, an I/O structure 210 is formed over the second interconnect structure 114, thereby defining a second IC structure 103 over the first IC structure 101. In various embodiments, the I/O structure 210. The I/O structure 210 comprises a plurality of upper I/O contacts 216 (e.g., contact pads, solder bumps, etc.) that directly overlie a corresponding upper I/O via 214. The upper I/O contacts 216 and the upper I/O vias 214 are disposed within an upper dielectric structure 212.

Figure 14:
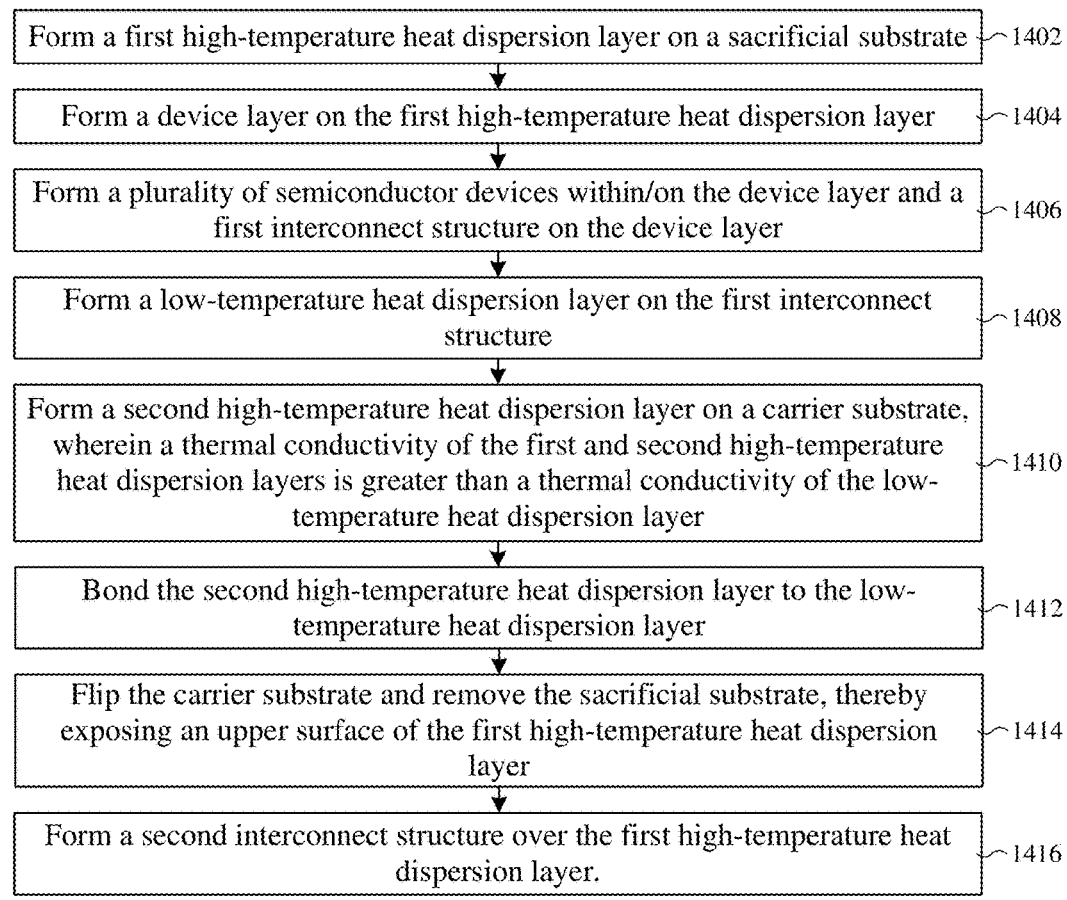
FIG. 14 illustrates some embodiments of a flow diagram of a method for forming a 3D IC structure comprising a plurality of heat dispersion layers.

FIG. 14 illustrates a flow diagram of some embodiments of a method 1400 for forming a 3D IC structure comprising a plurality of heat dispersion layers. While the method 1400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1402, a first high-temperature heat dispersion layer is formed on a sacrificial substrate. FIG. 4 illustrates a cross-sectional view 400 corresponding to some embodiments of act 1402.

At act 1404, a device layer is formed on the first high-temperature heat dispersion layer. FIG. 5 illustrates a cross-sectional view 500 corresponding to some embodiments of act 1404.

At act 1406, a plurality of semiconductor devices is formed within/on the device layer and a first interconnect structure is formed on the device layer. FIG. 5 illustrates a cross-sectional view 500 corresponding to some embodiments of act 1406.

At act 1408, a low-temperature heat dispersion layer is formed on the first interconnect structure. FIG. 6 illustrates a cross-sectional view 600 corresponding to some embodiments of act 1408.

At act 1410, a second high-temperature heat dispersion layer is formed on a carrier substrate. A thermal conductivity of the first and second high-temperature heat dispersion layers is greater than a thermal conductivity of the low-temperature heat dispersion layer. FIG. 7 illustrates a cross-sectional view 700 corresponding to some embodiments of act 1410.

At act 1412, the second high-temperature heat dispersion layer is bonded to the low-temperature heat dispersion layer. FIG. 8 illustrates a cross-sectional view 800 corresponding to some embodiments of act 1412.

At act 1414, the carrier substrate is flipped and the sacrificial substrate is removed, thereby exposing an upper surface of the first high-temperature heat dispersion layer. FIG. 9 illustrates a cross-sectional view 900 corresponding to some embodiments of act 1414.

At act 1416, a second interconnect structure is formed over the first high-temperature heat dispersion layer. FIGS. 10-12 illustrate cross-sectional views 1000-1200 corresponding to some embodiments of act 1416.

FIGS. 15-19 illustrate cross-sectional views 1500-1900 of some embodiments of a second method for forming a 3D IC structure comprising a plurality of heat dispersion layers. For example, FIGS. 15-19 illustrate alternative embodiments of acts that may be performed in the place of the acts at FIGS. 4-9 of the method of FIGS. 4-13. Thus, in some embodiments, the second method includes a method that alternatingly proceeds from FIGS. 15-19 to FIGS. 10-13 (i.e., skipping FIGS. 4-9).

Figure 15:
FIGS. 15-19 illustrate cross-sectional views of an alternative embodiment of the method of FIGS. 4-13.

As shown in the cross-sectional view 1500 of FIG. 15, a device layer 110 is provided and a first high-temperature heat dispersion layer 112 is formed along a back-side surface 110b of the device layer 110. In some embodiments, the device layer 110 may, for example, be or comprise bulk silicon, any type of semiconductor body (e.g., silicon, SiGe, etc.), a silicon-on-insulator (SOI) substrate, monocrystalline silicon, polysilicon, some other semiconductor material, or any combination of the foregoing. In various embodiments, the first high-temperature heat dispersion layer 112 completely covers the back-side surface 110b of the device layer 110. In further embodiments, the first high-temperature heat dispersion layer 112 has a first thermal conductivity within a range of approximately 500 to 2,000 W/m-K, or another suitable value. In various embodiments, the first high-temperature heat dispersion layer 112 may, for example, be or comprise aluminum nitride (e.g., AlN), aluminum oxide (e.g., Al$_2$O$_3$), silicon nitride (e.g., Si$_3$N$_4$), silicon carbide (e.g., SiC), carbon (e.g., such as diamond, graphene, or the like), boron nitride (e.g., BN), beryllium oxide (e.g., BeO), magnesium oxide (e.g., MgO), another suitable material, or any combination of the foregoing. In further embodiments, the first high-temperature heat dispersion layer 112 is formed to a thickness within a range of approximately 10 nanometers (nm) to 5 micrometers (um), or another suitable thickness value.

In some embodiments, a process for forming the first high-temperature heat dispersion layer 112 comprises depositing the first high-temperature heat dispersion layer 112 by CVD, PVD, ALD, some other deposition process, or any combination of the foregoing. In further embodiments, the first high-temperature heat dispersion layer 112 is deposited at high processing temperatures of approximately 400 degrees Celsius or greater. Depositing (e.g., by CVD, PVD, or ALD) the first high-temperature heat dispersion layer 112 at the high processing temperatures ensures the first high-temperature heat dispersion layer 112 has the first thermal conductivity (e.g., within the range of approximately 500 to 2,000 W/m-K). This, in part, is because the high processing temperatures ensure the first high-temperature heat dispersion layer 112 is formed with a crystalline structure with relatively large grain sizes that facilitates the dispersion of heat across the crystalline structure of the first high-temperature heat dispersion layer 112. In various embodiments, the first thermal conductivity of the first high-temperature heat dispersion layer 112 is relatively large (e.g., greater than 500 W/m-K) and facilitates the dispersion of heat during subsequent processing steps and/or during operation of semiconductor devices formed on/over the device layer 110.

Figure 16:
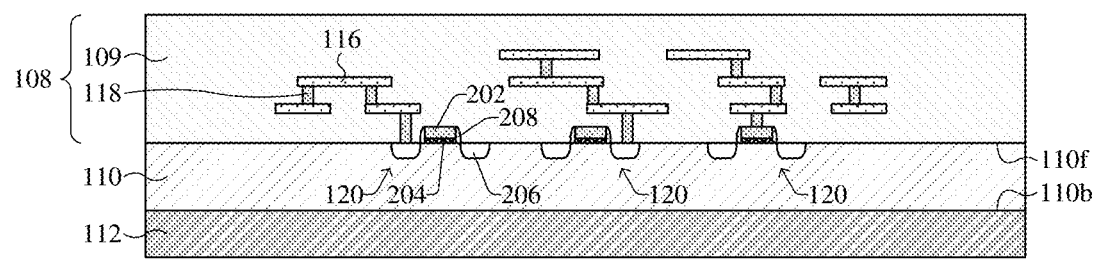

As shown in the cross-sectional view 1600 of FIG. 16, the device layer 110 is flipped, and a plurality of FEOL semiconductor devices 120 and a first interconnect structure 108 are formed over/on a front-side surface 110f of the device layer 110. In various embodiments, the FEOL semiconductor devices 120 and the first interconnect structure 108 may be formed as illustrated and/or described in FIG. 5.

Figure 17:
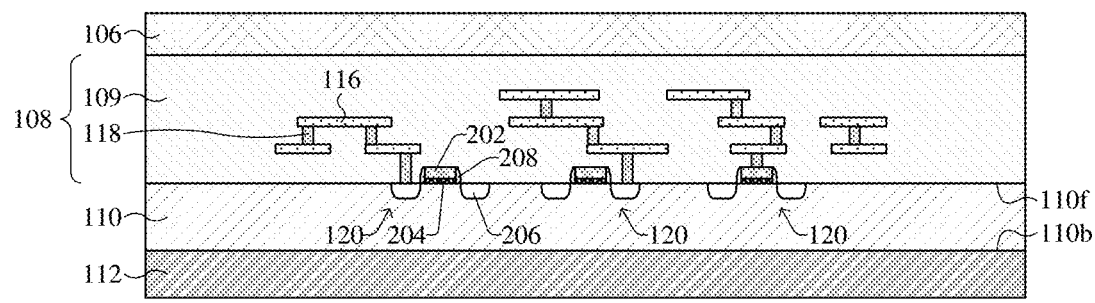

As shown in the cross-sectional view 1700 of FIG. 17, a low-temperature heat dispersion layer 106 is formed along an upper surface of the first interconnect structure 108. In various embodiments, the low-temperature heat dispersion layer 106 may be formed as illustrated and/or described in FIG. 6.

Figure 18:

As shown in the cross-sectional view 1800 of FIG. 18, a second high-temperature heat dispersion layer 104 is formed along an upper surface of a carrier substrate 102. In some embodiments, the carrier substrate 102 is or comprises monocrystalline silicon, some other silicon material, some other semiconductor material, or any combination of the foregoing. In various embodiments, the second high-temperature heat dispersion layer 104 completely covers the upper surface of the carrier substrate 102. In further embodiments, the second high-temperature heat dispersion layer 104 has the first thermal conductivity within a range of approximately 500 to 2,000 W/m-K, or another suitable value. In yet further embodiments, the second high-temperature heat dispersion layer 104 may be formed as illustrated and/or described in FIG. 7.

Figure 19:
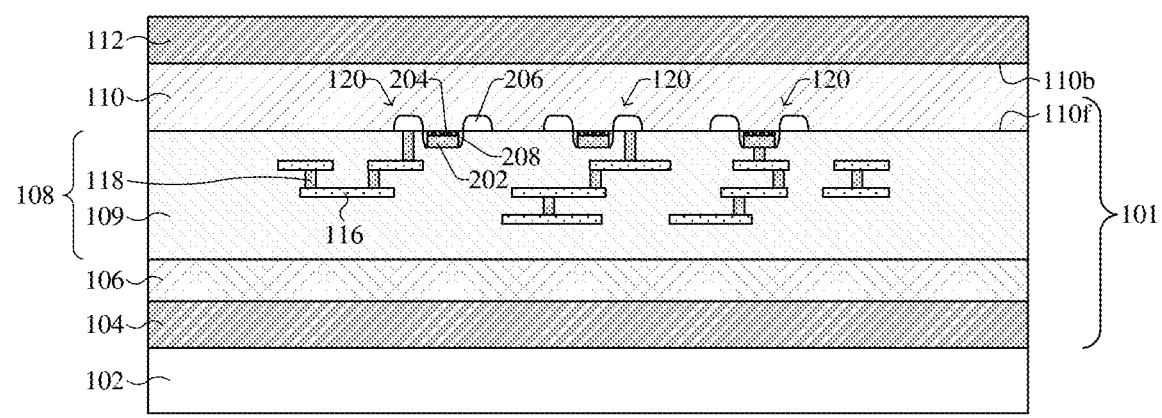

As shown in the cross-sectional view 1900 of FIG. 19, the structure of FIG. 17 is flipped and bonded to the second high-temperature heat dispersion layer 104, thereby defining a first IC structure 101. In various embodiments, the second high-temperature heat dispersion layer 104 and the low-temperature heat dispersion layer 106 meet at a bonding interface that comprises dielectric-to-dielectric bonds between the second high-temperature heat dispersion layer 104 and the low-temperature heat dispersion layer 106. In yet further embodiments, the second high-temperature heat dispersion layer 104 is bonded to the low-temperature heat dispersion layer 106 by, for example, fusion bonding, or another suitable bonding process at temperatures less than 400 degrees Celsius. Bonding the second high-temperature heat dispersion layer 104 to the low-temperature heat dispersion layer 106 with the temperatures less than 400 degrees Celsius mitigates damage to the first interconnect structure 108 and the first plurality of FEOL semiconductor devices 120.

Accordingly, in some embodiments, the present disclosure relates to a 3D IC structure comprising a first interconnect structure underlying a device layer and a second interconnect structure overlying the device layer. The 3D IC structure comprises a plurality of heat dispersion layers including a first heat dispersion layer disposed between the second interconnect structure and the device layer, and a second heat dispersion layer disposed along the first interconnect structure.

In some embodiments, the present application provides a semiconductor structure including: a device layer comprising a front-side surface opposite a back-side surface; a first heat dispersion layer disposed along the back-side surface of the device layer; and a second heat dispersion layer underlying the front-side surface of the device layer, wherein the second heat dispersion layer has a thermal conductivity lower than a thermal conductivity of the first heat dispersion layer.

In some embodiments, the present application provides an integrated chip including: a device layer comprising a front-side surface opposite a back-side surface; a plurality of semiconductor devices disposed on the front-side surface of the device layer; a first interconnect structure disposed along the front-side surface of the device layer; a second interconnect structure disposed above the back-side surface of the device layer, wherein the first and second interconnect structures respectively comprise a plurality of conductive wires and a plurality of conductive vias disposed within an interconnect dielectric structure and electrically coupled to the plurality of semiconductor devices; and a first heat dispersion layer disposed between the back-side surface of the device layer and the second interconnect structure, wherein a first thermal conductivity of the first heat dispersion layer is greater than a thermal conductivity of the interconnect dielectric structure.

In some embodiments, the present application provides a method for forming a semiconductor structure, including: forming a first heat dispersion layer along a semiconductor substrate, wherein the first heat dispersion layer is formed by a high temperature deposition process; forming a device layer over the first heat dispersion layer; forming a plurality of semiconductor devices along a front-side surface of the device layer; forming a first interconnect structure along the front-side surface of the device layer, wherein the first interconnect structure comprises a plurality of conductive wires and a plurality of conductive vias disposed within an interconnect dielectric structure; and forming a second heat dispersion layer along the interconnect dielectric structure, wherein the second heat dispersion layer is formed by a low temperature deposition process, wherein the low temperature is less than the high temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a first heat dispersion layer along a semiconductor substrate, wherein the first heat dispersion layer is formed by a high temperature deposition process;
   forming a device layer over the first heat dispersion layer;
   forming a plurality of semiconductor devices along a front-side surface of the device layer;
   forming a first interconnect structure along the front-side surface of the device layer, wherein the first interconnect structure comprises a plurality of conductive wires and a plurality of conductive vias disposed within an interconnect dielectric structure; and
   forming a second heat dispersion layer along the interconnect dielectric structure, wherein the second heat dispersion layer is formed by a low temperature deposition process, wherein the low temperature is less than the high temperature.

2. The method of claim 1, wherein the low temperature is less than 400 degrees Celsius and the high temperature is 400 degrees Celsius or greater.

3. The method of claim 1, further comprising:
   forming a third heat dispersion layer over a carrier substrate, wherein the third heat dispersion layer is formed by the high temperature deposition process;
   bonding the third heat dispersion layer to the second heat dispersion layer;
   removing the semiconductor substrate, thereby exposing an upper surface of the first heat dispersion layer; and
   forming a second interconnect structure over the first heat dispersion layer.

4. The method of claim 1, wherein a thermal conductivity of the first heat dispersion layer is greater than a thermal conductivity of the second heat dispersion layer.

5. The method of claim 1, wherein grain sizes of the first heat dispersion layer are larger than grain sizes of the second heat dispersion layer.

6. The method of claim 1, further comprising:
   forming a plurality of through substrate via (TSVs) through the first heat dispersion layer and the device layer, wherein the TSVs are electrically coupled to the plurality of conductive wires and the plurality of conductive vias.

7. The method of claim 6, further comprising:
   forming a second interconnect structure on the first heat dispersion layer, wherein the second interconnect structure comprises a plurality of second conductive wires and a plurality of second conductive vias electrically coupled to the plurality of TSVs.

8. The method of claim 1, wherein a thickness of the device layer is greater than a thickness of the first heat dispersion layer and a thickness of the second heat dispersion layer.

9. A method for forming a semiconductor structure, comprising:
   forming a device layer on a first heat dispersion layer, wherein the first heat dispersion layer is disposed along a back-side surface of the device layer, and wherein the first heat dispersion layer has a first thermal conductivity;
   forming a dielectric structure on a front-side surface of the device layer; and
   forming a second heat dispersion layer on the dielectric structure, wherein the second heat dispersion layer has a second thermal conductivity less than the first thermal conductivity.

10. The method of claim 9, wherein the second thermal conductivity is greater than a thermal conductivity of the dielectric structure.

11. The method of claim 9, further comprising:
    bonding a third heat dispersion layer to the second heat dispersion layer, wherein a bonding interface is disposed between the second heat dispersion layer and the third heat dispersion layer, and wherein the third heat dispersion layer has a third thermal conductivity greater than the second thermal conductivity.

12. The method of claim 11, wherein the second heat dispersion layer and the third heat dispersion layer comprise a same dielectric material.

13. The method of claim 11, wherein the second heat dispersion layer is formed on the dielectric structure at a first temperature, wherein bonding the third heat dispersion layer to the second heat dispersion layer is performed at a second temperature that is equal to or less than the first temperature.

14. The method of claim 13, wherein the third heat dispersion layer is formed at a third temperature on a carrier substrate, wherein the third temperature is greater than the first temperature.

15. The method of claim 11, wherein the first heat dispersion layer directly contacts the back-side surface of the device layer, the second heat dispersion layer directly contacts the dielectric structure, and the third heat dispersion layer directly contacts the second heat dispersion layer.

16. The method of claim 9, further comprising:
    forming a plurality of conductive vias and a plurality of conductive wires within the dielectric structure, wherein the first thermal conductivity is greater than a thermal conductivity of the plurality of conductive wires and the plurality of conductive vias.

17. A method for forming a semiconductor structure, comprising:
- forming a first heat dispersion layer on a back-side surface of a device layer, wherein the device layer has a front-side surface opposite the back-side surface;
- forming a first interconnect structure on the front-side surface of the device layer;
- forming a second heat dispersion layer on the first interconnect structure, wherein grain sizes of the first heat dispersion layer are larger than grain sizes of the second heat dispersion layer; and
- forming a third heat dispersion layer on the second heat dispersion layer, wherein grain sizes of the third heat dispersion layer are larger than the grain sizes of the second heat dispersion layer.

18. The method of claim 17, wherein forming the third heat dispersion layer comprises:
- depositing the third heat dispersion layer on a carrier substrate; and
- bonding the third heat dispersion layer to the second heat dispersion layer.

19. The method of claim 17, wherein the first heat dispersion layer and the second heat dispersion layer comprise aluminum nitride, aluminum oxide, silicon nitride, silicon carbide, diamond, graphene, boron nitride, beryllium oxide, or magnesium oxide.

20. The method of claim 9, wherein the first heat dispersion layer has a thermal conductivity within a range of about 500 to 2,000 W/m-K and the second heat dispersion layer has a thermal conductivity within a range of about 5 to 500 W/m-K.

* * * * *